United States Patent
Toi

(10) Patent No.: US 11,838,152 B2
(45) Date of Patent: Dec. 5, 2023

(54) SEMICONDUCTOR INTEGRATED CIRCUIT AND RECEPTION DEVICE

(71) Applicant: Kioxia Corporation, Tokyo (JP)

(72) Inventor: Takashi Toi, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/682,872

(22) Filed: Feb. 28, 2022

(65) Prior Publication Data

US 2023/0090707 A1 Mar. 23, 2023

(30) Foreign Application Priority Data

Sep. 21, 2021 (JP) .................. 2021-153200

(51) Int. Cl.
*H03H 7/30* (2006.01)
*H03H 7/40* (2006.01)
(Continued)

(52) U.S. Cl.
CPC .... *H04L 25/03057* (2013.01); *H01L 23/5227* (2013.01); *H03F 3/189* (2013.01); *H03M 1/12* (2013.01); *H04L 25/03878* (2013.01)

(58) Field of Classification Search
CPC ......... H04L 25/03057; H04L 25/03878; H04L 27/01; H01L 23/5227; H03M 1/12; H03F 3/189; H03F 3/4565; H03B 5/08
(Continued)

(56) References Cited

U.S. PATENT DOCUMENTS 8,335,249 B1 12/2012 Su et al.
9,806,915 B1 10/2017 Elzeftawi et al.
(Continued)

FOREIGN PATENT DOCUMENTS

| JP | 2019-514312 A | 5/2019 |
| JP | 2020-048021 A | 3/2020 |
| JP | 2020-522931 A | 7/2020 |

OTHER PUBLICATIONS

Atharav and Behzad Razavi, "A 56-GB/s 50-mW NRZ Receiver in 28-nm CMOS", Electrical Engineering Department University of California, Los Angeles, 2021 IEEE, International Solid-State Circuits Conference, Paper 11.7, 2021; 27 pages.

*Primary Examiner* — Phuong Phu

(74) *Attorney, Agent, or Firm* — Foley & Lardner LLP

(57) ABSTRACT

A semiconductor integrated circuit includes a substrate including a first wiring layer and a second wiring layer that is separated from the first wiring layer in a stacking direction, and an equalization circuit formed on the substrate to amplify a signal level of a part of a frequency bandwidth included in a differential input signal including a first signal and a second signal, and output a differential output signal including a third signal and a fourth signal, in which the equalization circuit includes a first transistor, a first inductor element, a second transistor, and a second inductor element, each of the first inductor element and the second inductor element has a first inductor portion, a second inductor portion, and a third inductor portion, the first inductor portion and the second inductor portion include single-layer winding coils, a third end portion of the third inductor portion is electrically connected to a first end portion of the first inductor portion, and a fourth end portion of the third inductor portion is electrically connected to a second end portion of the second inductor portion.

20 Claims, 13 Drawing Sheets

(51) Int. Cl.
  *H03K 5/159* (2006.01)
  *H04L 25/03* (2006.01)
  *H01L 23/522* (2006.01)
  *H03M 1/12* (2006.01)
  *H03F 3/189* (2006.01)

(58) Field of Classification Search
  USPC .................. 375/220, 230, 316, 346, 360
  See application file for complete search history.

(56) References Cited

U.S. PATENT DOCUMENTS

| | | |
|---|---|---|
| 9,966,908 B1 | 5/2018 | Carey |
| 10,491,299 B2 | 11/2019 | Park et al. |
| 10,622,974 B2 | 4/2020 | Takeuchi |
| 11,381,427 B1 * | 7/2022 | Lin .................. H03F 3/4565 |
| 11,495,382 B2 * | 11/2022 | Elzinga ................ H03B 5/08 |
| 2021/0287987 A1 | 9/2021 | Urakawa |
| 2022/0360476 A1 * | 11/2022 | Palusa ................. H04L 27/01 |

* cited by examiner

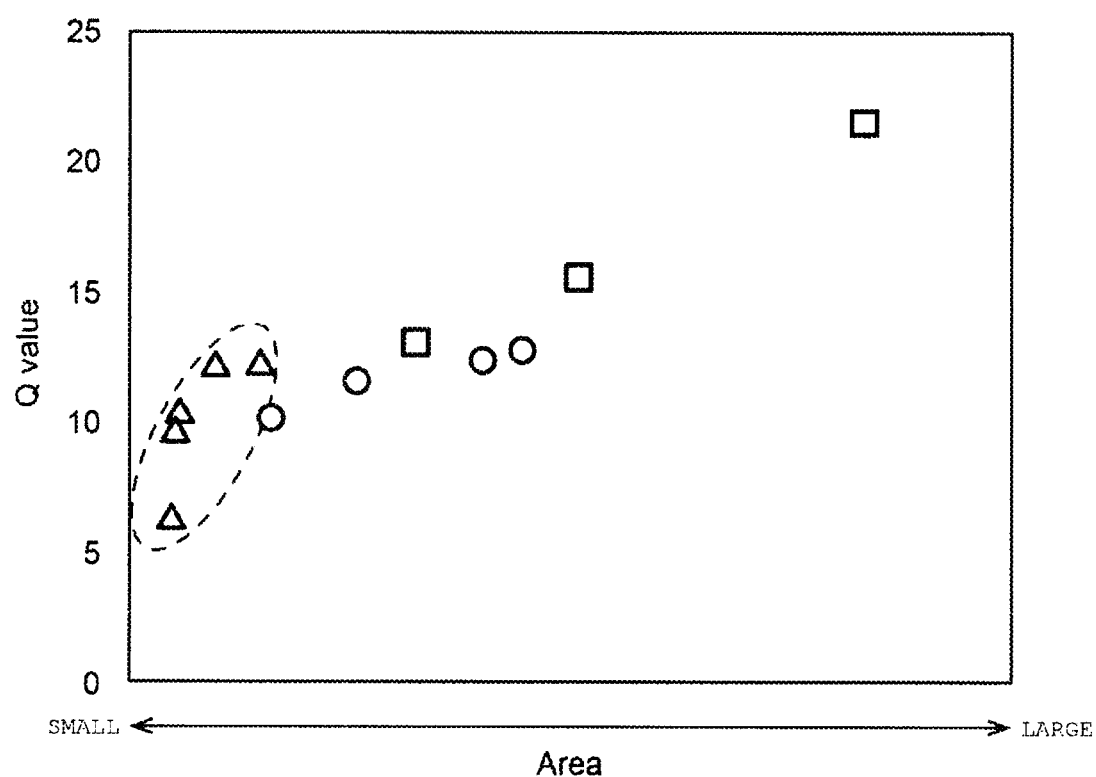

60a : CTLE

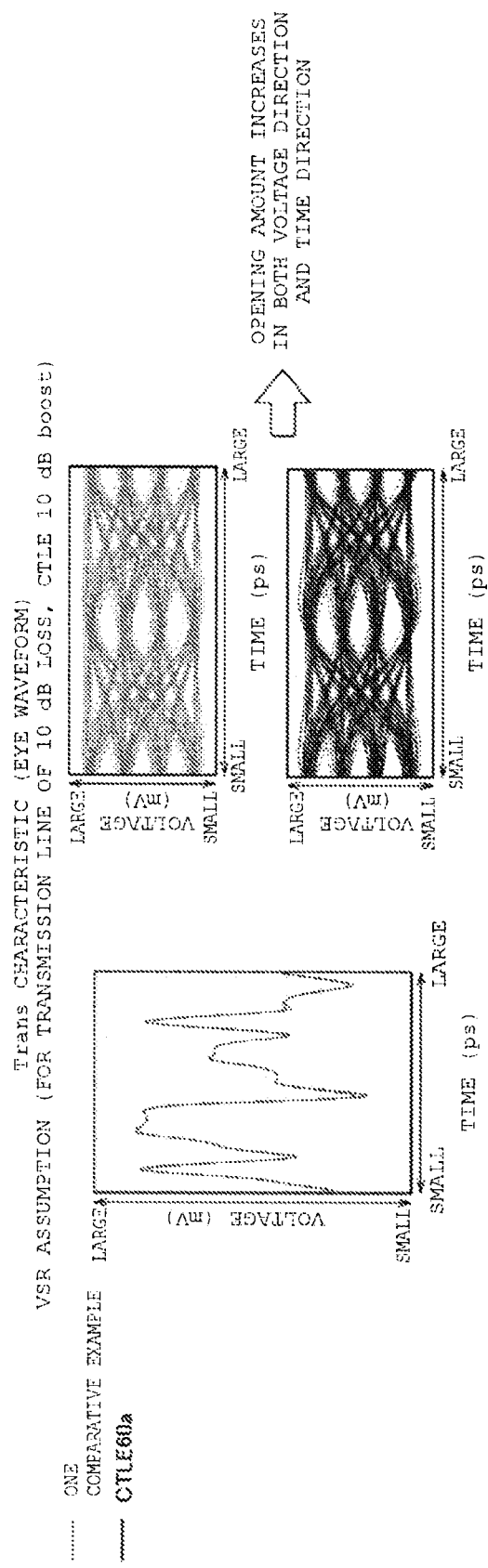

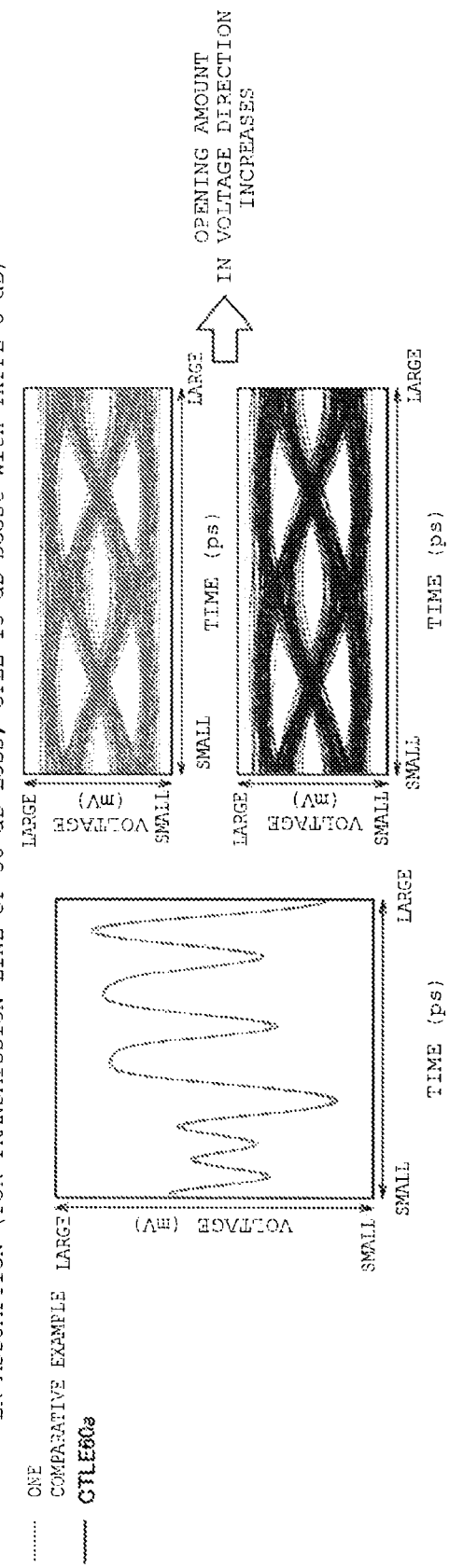

SEMICONDUCTOR INTEGRATED CIRCUIT AND RECEPTION DEVICE

CROSS-REFERENCE TO RELATED APPLICATION

This application is based upon and claims the benefit of priority from Japanese Patent Application No. 2021-153200, filed Sep. 21, 2021, the entire contents of which are incorporated herein by reference.

FIELD

Embodiments described herein relate generally to a semiconductor integrated circuit and a reception device.

BACKGROUND

The amount of data handled by electronic apparatuses such as smartphones and personal computers is increasing year by year, and a circuit technology of transmitting a large amount of data at high speed and with low power consumption is required. In a high speed transmission circuit, a differential signal is often transmitted and received to reduce noise. In a reception device that receives the differential signal, an equalization process is performed to reduce a high frequency loss of the received differential signal. An equalizer that performs the equalization process has an inductor. When the reception device including the equalizer is made into a chip, it is necessary to form the inductor on a semiconductor substrate, and there is a problem that the reception device cannot be miniaturized when an occupied area of the inductor becomes large.

DESCRIPTION OF THE DRAWINGS

FIG. 10 is a graph illustrating an example of a relationship between a Q value and an occupied area.

FIGS. 15A and 15B are diagrams illustrating transient characteristics of a CTLE according to the second embodiment.

DETAILED DESCRIPTION

Embodiments provide a semiconductor integrated circuit and a reception device capable of reducing an occupied area of an inductor.

In general, according to at least one embodiment, there is provided a semiconductor integrated circuit including: a substrate including a first wiring layer and a second wiring layer that is separated from the first wiring layer in a stacking direction; an equalization circuit formed on the substrate to amplify a signal level of a part of a frequency bandwidth included in a differential input signal including a first signal and a second signal having logics opposite to each other, and output a differential output signal including a third signal corresponding to the first signal and a fourth signal corresponding to the second signal; a first node to which the first signal is input; a second node to which the second signal is input; a third node from which the third signal is output; and a fourth node from which the fourth signal is output, in which the equalization circuit includes a first transistor having a gate connected to the first node and a drain connected to the third node, a first inductor element and a first resistance element connected in series between the drain of the first transistor and a first reference voltage node, a second transistor having a gate connected to the second node and a drain connected to the fourth node, and a second inductor element and a second resistance element connected in series between the drain of the second transistor and the first reference voltage node, each of the first inductor element and the second inductor element is a part of a synthetic inductor element having a first inductor portion, a second inductor portion, and a third inductor portion, the first inductor portion is provided in a first region of the first wiring layer, has a first end portion, and includes a single-layer winding coil, the second inductor portion is provided in a second region of the first wiring layer, which is different from the first region, has a second end portion, and includes a single-layer winding coil, the third inductor portion is provided at the second wiring layer, and has a third end portion and a fourth end portion, and the third end portion of the third inductor portion is electrically connected to the first end portion of the first inductor portion, and the fourth end portion of the third inductor portion is electrically connected to the second end portion of the second inductor portion.

Hereinafter, embodiments of a semiconductor integrated circuit and a reception device will be described with reference to the drawings. In the following, main components of the semiconductor integrated circuit and the reception device will be mainly described, and the semiconductor integrated circuit and the reception device may have components or functions not illustrated or described. The following description does not exclude the components or the functions not illustrated or described.

Figure 1:
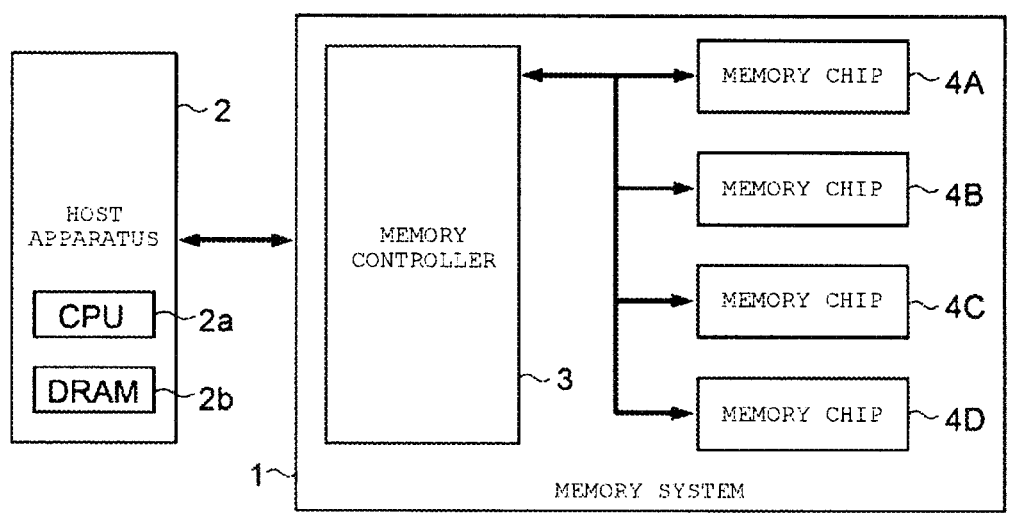
FIG. 1 is a block diagram illustrating a schematic configuration of a memory system including a memory controller according to at least one embodiment.

FIG. 1 is a block diagram illustrating a schematic configuration of a memory system 1 including a memory controller 3 according to an embodiment. The memory system 1 in FIG. 1 includes the memory controller 3 and memory chips 4 (4A, 4B, 4C, and 4D). Although the four memory chips 4A, 4B, 4C, and 4D are illustrated in FIG. 1, the number of memory chips 4 is selected according to specifications of the memory system 1.

The memory system 1 can be connected to a host apparatus 2. The host apparatus 2 is, for example, an electronic apparatus such as a personal computer, a mobile terminal, an in-vehicle device, or a server. The host apparatus 2 may have a central processing unit (CPU) 2a as a processor, a ROM (not illustrated), and a dynamic random access memory (DRAM) 2b. The memory system 1 stores user data (hereinafter, simply referred to as data) from the host apparatus 2 into each memory chip 4, or reads the data stored in each memory chip 4 and outputs the read data to the host apparatus 2, in response to a request from the host apparatus 2. Specifically, the memory system 1 can write the data to each memory chip 4 in response to a write request from the host apparatus 2, and can read the data from each memory chip 4 in response to a read request from the host apparatus 2.

The memory system 1 may be a universal flash storage (UFS) device, a ball grid array (BGA) type solid state drive (SSD), or the like in which the memory controller 3 and a plurality of memory chips 4 are configured as one package. The memory system 1 may be a solid state drive (SSD) or the like having a connector portion that can be connected to the host apparatus 2. In FIG. 1, the memory system 1 is illustrated as being connected to the host apparatus 2.

The memory chip 4 is a semiconductor memory device configured with a NAND flash memory or the like that stores data non-volatilely. As illustrated in FIG. 1, the memory controller 3 and each memory chip 4 are connected via a NAND bus. The memory controller 3 controls a write of data to the memory chip 4 according to the write request from the host apparatus 2. Further, the memory controller 3 controls a read of data from the memory chip 4 according to the read request from the host apparatus 2. The memory controller 3 may voluntarily control the write and read of data to and from the memory chip 4, irrespective of the requests from the host apparatus 2.

Figure 2:
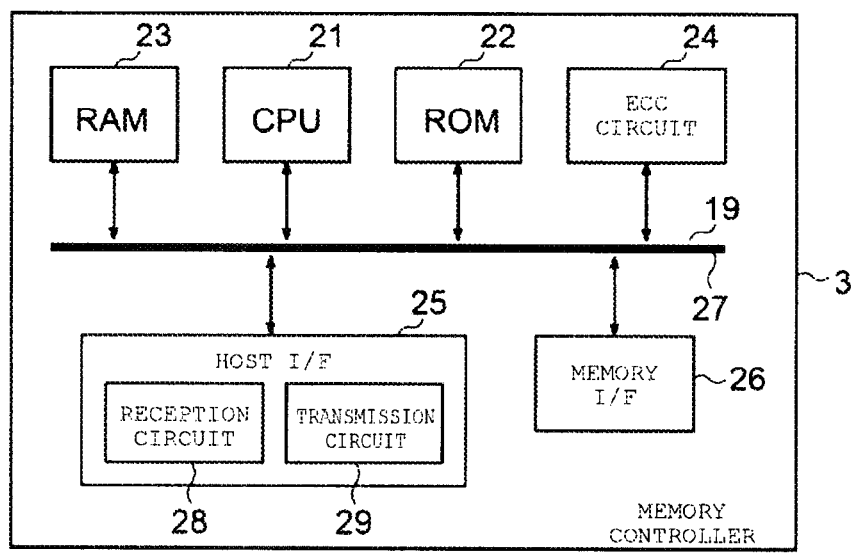
FIG. 2 is a block diagram illustrating an internal configuration of the memory controller.

FIG. 2 is a block diagram illustrating an internal configuration of the memory controller 3. In FIG. 2, the memory controller 3 includes a CPU 21, a ROM 22, a random access memory (RAM) 23, an error check and correct (ECC) circuit 24, a host interface (I/F) 25, and a memory interface (I/F) 26. The CPU 21, the ROM 22, the RAM 23, the ECC circuit 24, the host I/F 25, and the memory I/F 26 are connected to each other by an internal bus 27.

The host I/F 25 has a reception circuit 28 and a transmission circuit 29. The reception circuit 28 includes a semiconductor integrated circuit and a reception device according to the at least one embodiment. The reception circuit 28 receives data from the host apparatus 2, and outputs a request, write data, or the like included in the received data to the internal bus 27. The transmission circuit 29 transmits user data read from the memory chip 4 or a response or the like from the CPU 21 to the host apparatus 2. It is noted that the host apparatus 2 also has an interface (I/F) including the reception circuit 28 and the transmission circuit 29 (not illustrated) corresponding to the reception circuit 28 and the transmission circuit 29 of the host I/F 25.

The host apparatus 2 and the reception circuit 28 and the transmission circuit 29 of the host I/F 25 are connected via a predetermined interface. For example, as this interface, various interfaces such as a parallel interface of an embedded multi media card (eMMC), a serial extension interface of a peripheral component interconnect-express (PCIe), and a high speed serial interface of M-PHY are adopted.

The memory I/F 26 controls a process of writing user data or the like to each memory chip 4 and a process of reading the user data or the like from each memory chip 4 based on an instruction from the CPU 21.

The CPU 21 controls the memory controller 3 in an integrated manner. The CPU 21 may be called a micro processing unit (MPU). When the CPU 21 receives a request from the host apparatus 2 via the host I/F 25, the CPU 21 performs control according to the request. For example, the CPU 21 instructs the memory I/F 26 to write user data to each memory chip 4 in response to the request from the host apparatus 2. Further, the CPU 21 instructs the memory I/F 26 to read the user data from each memory chip 4 in response to the request from the host apparatus 2.

The CPU 21 determines a storage region (hereinafter, referred to as a memory region) on each memory chip 4, for user data stored in the RAM 23. The user data is stored into the RAM 23 via the internal bus 27. The CPU 21 determines the memory region for, for example, data in page unit, which is a write unit, that is, page data.

When the CPU 21 receives the write request from the host apparatus 2, the CPU 21 determines the memory region of each memory chip 4 to be written. A physical address is assigned to the memory region of the memory chip 4. The CPU 21 manages the memory region to which the data is to be written by using the physical address. The CPU 21 instructs the memory I/F 26 to designate a physical address of the determined memory region, and write user data to the memory chip 4. The CPU 21 receives a write request including a logical address managed by the host apparatus 2 from the host apparatus 2. The CPU 21 manages a correspondence between the logical address of the user data and the physical address to which the user data is written. When the CPU 21 receives a read request including a logical address from the host apparatus 2, the CPU 21 specifies a physical address corresponding to the logical address, designates the physical address, and instructs the memory I/F 26 to read the user data.

The ECC circuit 24 encodes the user data stored in the RAM 23 to generate a codeword. Further, the ECC circuit 24 decodes the codeword read from each memory chip 4. The RAM 23 temporarily stores the user data received from the host apparatus 2 before being stored into each memory chip 4, or temporarily stores data read from each memory chip 4 before being transmitted to the host apparatus 2. The RAM 23 is, for example, a general-purpose memory such as static random access memory (SRAM) or dynamic random access memory (DRAM). The RAM 23 may be disposed outside the memory controller 3.

FIG. 2 illustrates a configuration example in which the memory controller 3 respectively includes the ECC circuit 24 and the memory I/F 26. Meanwhile, the ECC circuit 24 may be embedded into the memory I/F 26. Further, the ECC circuit 24 may be embedded into each memory chip 4.

When a write request is received from the host apparatus 2, the memory controller 3 operates as follows. The CPU 21 temporarily stores write data into the RAM 23. The CPU 21 reads the data stored in the RAM 23, and inputs the data to the ECC circuit 24. The ECC circuit 24 encodes the input data, and provides the codeword to the memory I/F 26. The memory I/F 26 writes the input codeword to each memory chip 4.

When a read request is received from the host apparatus 2, the memory controller 3 operates as follows. The memory I/F 26 provides the codeword read from each memory chip 4 to the ECC circuit 24. The ECC circuit 24 decodes the input codeword, and stores the decoded data into the RAM 23. The CPU 21 transmits the data stored in the RAM 23 to the host apparatus 2 via the host I/F 25.

Figure 3:
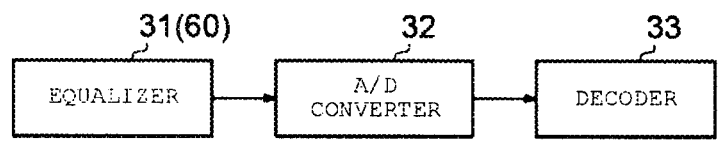
FIG. 3 is a block diagram illustrating an example of a specific configuration of a reception circuit in FIG. 2.

FIG. 3 is a block diagram illustrating an example of an internal configuration of the reception circuit 28 in FIG. 2. The reception circuit 28 receives transmission data from the host apparatus 2. As illustrated in FIG. 3, the reception circuit 28 includes an equalizer 31, an A/D converter 32, and a decoder 33.

The equalizer 31 is an analog circuit having a pass characteristic of amplifying a signal level more strongly as a frequency bandwidth becomes higher, to compensate for an attenuation of the signal level due to a transmission line of a differential input signal. The equalizer 31 is an example of a semiconductor integrated circuit according to at least one embodiment. For the pass characteristic of the equalizer 31, a gain drops when a bandwidth of the pass characteristic is exceeded, in the same manner as a normal amplifier circuit (amplifier). Since the equalizer 31 amplifies the signal level in the high frequency bandwidth more strongly, the equalizer 31 can compensate for the attenuation of the signal level due to the transmission line over a wide frequency range, as compared with the normal amplifier in which a pass characteristic is constant in a bandwidth. A specific example of the equalizer 31 according to at least one embodiment is a continuous time linear equalizer (CTLE) 60 that amplifies a signal level of a certain frequency bandwidth included in a differential input signal in a continuous time linear manner. In the following, an example in which the CTLE 60 is used as the equalizer 31 will be mainly described.

The A/D converter 32 converts an analog output signal of the equalizer 31 into a digital signal. More specifically, the A/D converter 32 receives a differential output signal of the equalizer 31 as a differential input signal. The A/D converter 32 synchronizes data included in the differential input signal with a clock signal extracted from the differential input signal, and outputs a digital signal corresponding to the data. The A/D converter 32 detects a reference voltage level based on the differential input signal. When the differential input signal is higher than the reference voltage level by a threshold voltage or more, the A/D converter 32 set a logical value to 1 to generate the digital signal, and when the differential input signal is lower than the threshold voltage, the A/D converter 32 set the logical value to 0 to generate the digital signal.

The differential input signal received by the reception circuit 28 includes an analog signal in which data encoded in a predetermined encoding format is modulated. Therefore, the decoder 33 performs a decoding process on the input digital signal in a decoding format corresponding to the predetermined encoding format, and restores the data before encoding.

Figure 4:
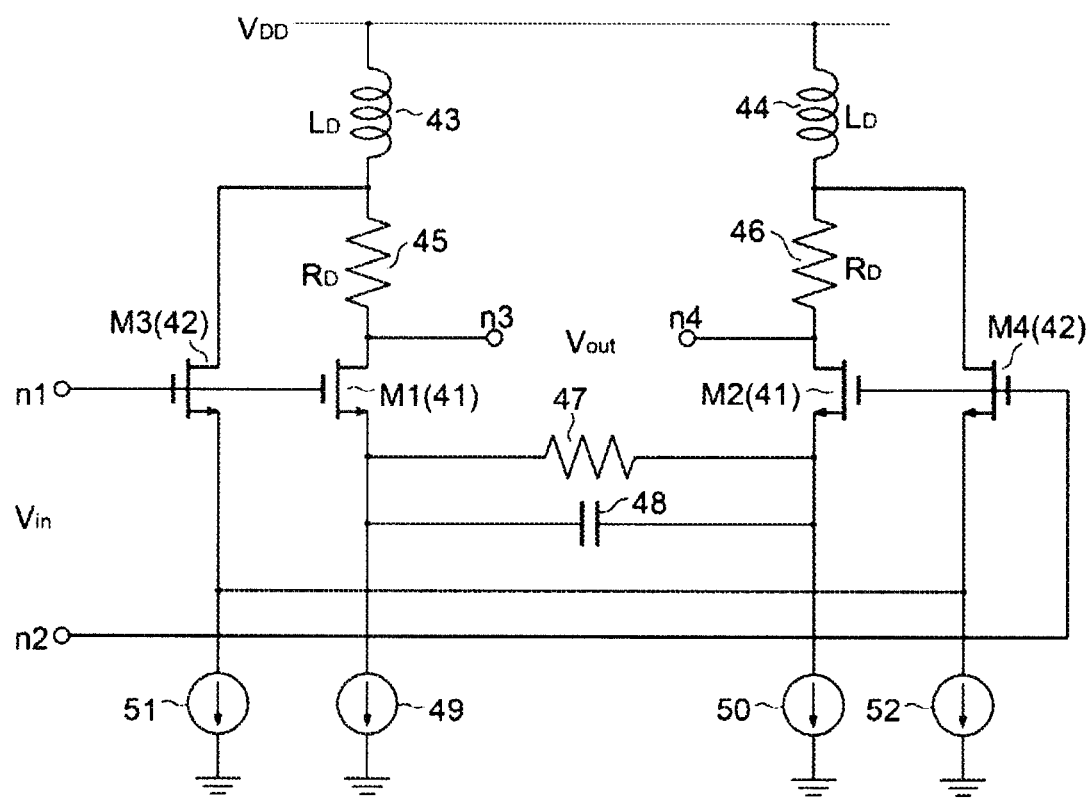
FIG. 4 is a circuit diagram of a CTLE according to at least one embodiment.

FIG. 4 is a circuit diagram of the CTLE 60 according to at least one embodiment. The CTLE 60 receives a differential input signal $V_{in}$, and outputs a differential output signal $V_{out}$. The CTLE 60 is implemented by a semiconductor device, and is formed on a substrate. The CTLE 60 includes a first differential transistor pair 41 including a first transistor M1 and a second transistor M2, a second differential transistor pair 42 including a third transistor M3 and a fourth transistor M4, a first inductor element 43, a second inductor element 44, a first resistance element 45, a second resistance element 46, a third resistance element 47, a first capacitor element 48, a first current source 49, a second current source 50, a third current sources 51, and a fourth current source 52. The first to fourth transistors M1 to M4 are, for example, NMOS transistors.

A gate of the first transistor M1 and a gate of the third transistor M3 are connected to a first node n1. A first signal, which is one of the differential input signals $V_{in}$, is input to the first node n1. A gate of the second transistor M2 and a gate of the fourth transistor M4 are connected to a second node n2. A second signal, which is the other of the differential input signals $V_{in}$, is input to the second node n2. The differential output signal $V_{out}$ is output from a third node n3 and a fourth node n4. The third node n3 is connected to a connection node between a drain of the first transistor M1 and one end of the first resistance element 45. The fourth node n4 is connected to a connection node between a drain of the second transistor M2 and one end of the second resistance element 46. The third resistance element 47 and the first capacitor element 48 are connected in parallel between a source of the first transistor M1 and a source of the second transistor M2.

The first inductor element 43 and the first resistance element 45 are connected in series between the drain of the first transistor M1 and a power supply voltage node (first reference voltage node) $V_{DD}$. The first current source 49 is connected between the source of the first transistor M1 and a ground node (second reference voltage node) GND. A power supply voltage of the CTLE 60 is applied to the power supply voltage node $V_{DD}$, and a reference voltage of the CTLE 60 is applied to the ground node GND.

The first inductor element 43 and the second inductor element 44 are passive inductors that do not require electric power. Specifically, as will be described below, the first inductor element 43 and the second inductor element 44 are formed by using a wiring layer of the substrate.

The second inductor element 44 and the second resistance element 46 are connected in series between the drain of the second transistor M2 and the power supply voltage node $V_{DD}$. The second current source 50 is connected between the source of the second transistor M2 and the ground node.

The third current source 51 is connected between a source of the third transistor M3 and the ground node, and the fourth current source 52 is connected between a source of the fourth transistor M4 and the ground node.

The CTLE 60 illustrated in FIG. 4 was a circuit configuration symmetrical between the first transistor M1 and the second transistor M2 facing each other, and circuit constants or electrical characteristics of each element in the left and right circuits are also symmetrical. For example, the electrical characteristics of the first transistor M1 and the second transistor M2 constituting the first differential transistor pair 41 are the same. In the same manner, the electrical characteristics of the third transistor M3 and the fourth transistor M4 constituting the second differential transistor pair 42 are the same. Further, inductances of the first inductor element 43 and the second inductor element 44 have a same value $L_D$, and resistance values of the first resistance element 45 and the second resistance element 46 have a same value $R_D$. The circuit configurations of the first current source 49 and the second current source 50 are the same. The circuit configurations of the third current source 51 and the fourth current source 52 are the same.

The CTLE 60 in FIG. 4 has a circuit configuration in which a first circuit and a second circuit having different gain characteristics are combined. The first circuit includes the first differential transistor pair 41, the first inductor element 43, the second inductor element 44, the first resistance element 45, the second resistance element 46, the first current source 49, and the second current source 50. The second circuit includes the second differential transistor pair 42, the first inductor element 43, the second inductor element 44, the first resistance element 45, the second resistance element 46, the third current source 51, and the fourth current source 52.

As described above, the first inductor element 43, the second inductor element 44, the first resistance element 45, and the second resistance element 46 are shared by the first circuit and the second circuit.

Since both the first circuit and the second circuit have a symmetrical circuit configuration, in the following, circuit configurations of a circuit on one side of the CTLE 60 (hereinafter, a CTLE half circuit 60h), a circuit on one side of the first circuit (hereinafter, a first half circuit 61h), and a circuit on one side of the second circuit (hereinafter, a second half circuit 62h), and gain characteristics will be described.

Figure 5:
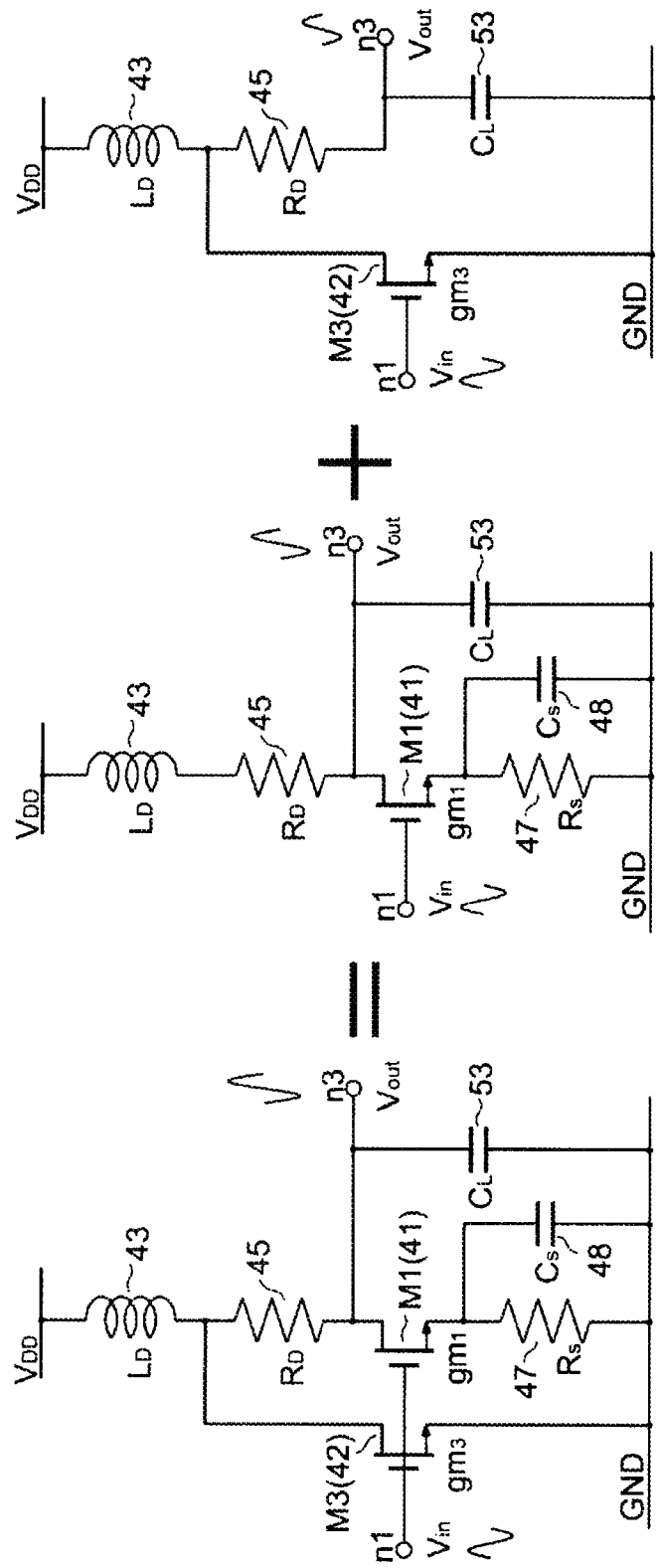
FIG. 5 is an equivalent circuit diagram of a CTLE half circuit.

FIG. 5 is an equivalent circuit diagram of the CTLE half circuit 60h. The CTLE half circuit 60h in FIG. 5 is equivalently configured with the first half circuit 61h and the second half circuit 62h.

The CTLE half circuit 60h includes the first transistor M1, the third transistor M3, the first inductor element 43, the first resistance element 45, the third resistance element 47, the first capacitor element 48, and a second capacitor element 53. Although not illustrated in FIG. 4, the second capacitor element 53 has a capacitance that is half of a total capacitance of a parasitic capacitance, an output capacitance, and the like between the third node n3 and the ground node GND of the CTLE 60 in FIG. 4. It is noted that in FIG. 5, the first current source 49 and the third current source 51 in FIG. 4 are omitted.

The first half circuit 61h has a circuit configuration in which the third transistor M3 is omitted from the CTLE half circuit 60h. The second half circuit 62h includes the third transistor M3, the first inductor element 43, the first resistance element 45, and the second capacitor element 52.

In FIG. 5, a transconductance of the first transistor M1 is $gm_1$, a transconductance of the third transistor M3 is $gm_3$, an inductance of the first inductor element 43 is $L_D$, a resistance value of the first resistance element 45 is $R_D$, a capacitance of the third capacitor element 54 is $C_s$, a resistance value of the third resistance element 47 is $R_s$, and a capacitance of a capacitor connected between the drain (third node n3) of the first transistor M1 and the ground node is $C_L$.

A gain $Av_{FF\text{-}CTLE}$ of the CTLE half circuit 60h is expressed by $Av_{FF\text{-}CTLE} = Av_{CTLE} + Av_{FF}$. $Av_{CTLE}$ is a gain of the first half circuit 61h, and $Av_{FF}$ is a gain of the second half circuit 62h.

The gain $Av_{CTLE}$ of the first half circuit 61h is expressed by the following equation (1) using the transfer function.

$$Av_{CTLE} = gm_1 \cdot \frac{1 + sR_sC_s}{(1 + gm_1R_s) + sR_sC_s} \cdot \frac{R_D + sL_D}{1 + sR_DC_L + s^2L_DC_L} \quad (1)$$

The gain $Av_{FF}$ of the second half circuit 62h is expressed by the following equation (2) using the transfer function.

$$Av_{FF} = gm_3 \cdot \frac{sL_D}{1 + sR_DC_L + s^2L_DC_L} \quad (2)$$

It is noted that a gain of the first circuit in which the two first half circuits 61h are arranged symmetrically is also expressed by the equation (1), and a gain of the second circuit in which the two second half circuits 62h are arranged symmetrically is also expressed by the equation (2).

Figure 6:
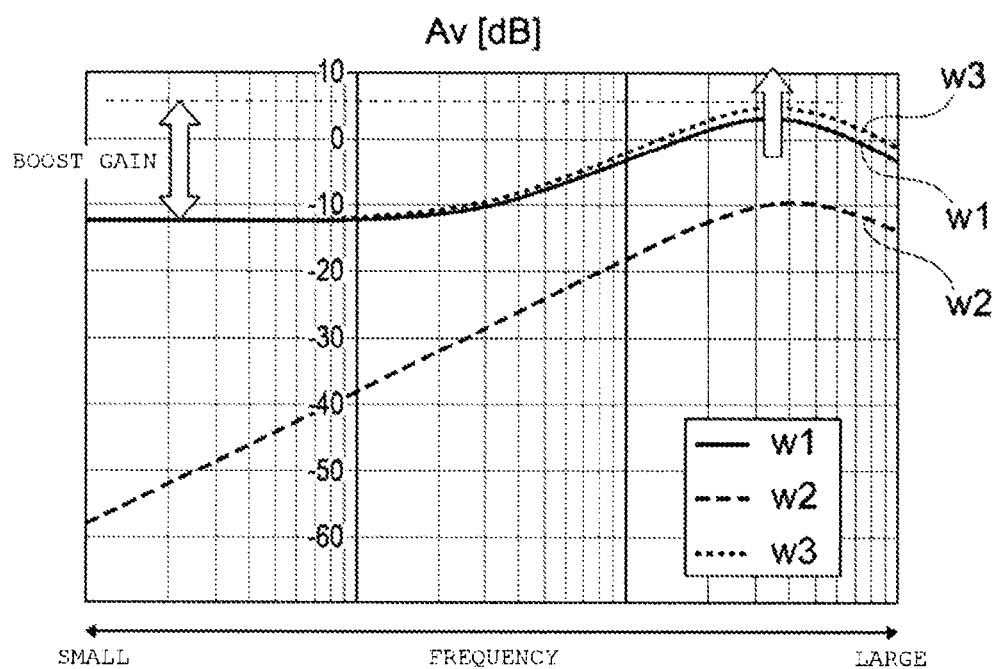
FIG. 6 is a diagram illustrating gain characteristics of the CTLE half circuit, a first half circuit, and a second half circuit.

FIG. 6 is a diagram illustrating gain characteristics of the CTLE half circuit 60h, the first half circuit 61h, and the second half circuit 62h, which are configured as illustrated in FIG. 5. A horizontal axis in FIG. 6 is a frequency [GHz], and a vertical axis is a gain Av [dB]. The gain characteristic corresponds to a gain characteristic with respect to a frequency, that is, a frequency characteristic. A waveform w1 in FIG. 6 illustrates a gain characteristic of the first half circuit 61h, a waveform w2 illustrates a gain characteristic of the second half circuit 62h, and a waveform w3 illustrates a gain characteristic of the CTLE half circuit 60h, respectively. As illustrated in FIG. 6, the first half circuit 61h has the effect of increasing a gain of a certain frequency bandwidth on a high frequency side, and by providing the second half circuit 62h, it is possible to further increase the gain of the certain frequency bandwidth on the high frequency side. By providing the first half circuit 61h and the second half circuit 62h in the CTLE half circuit 60h, it is possible to further increase a boost gain, which is a difference between the gain on a low frequency side and the gain of the certain frequency component on the high frequency side of the CTLE half circuit 60h.

In at least one embodiment, an inductor element 10 having excellent symmetry and being integrated is adopted as the first inductor element 43 and the second inductor element 44. FIGS. 7 to 10 are views illustrating the inductor element 10 according to the present embodiment.

Figure 7:
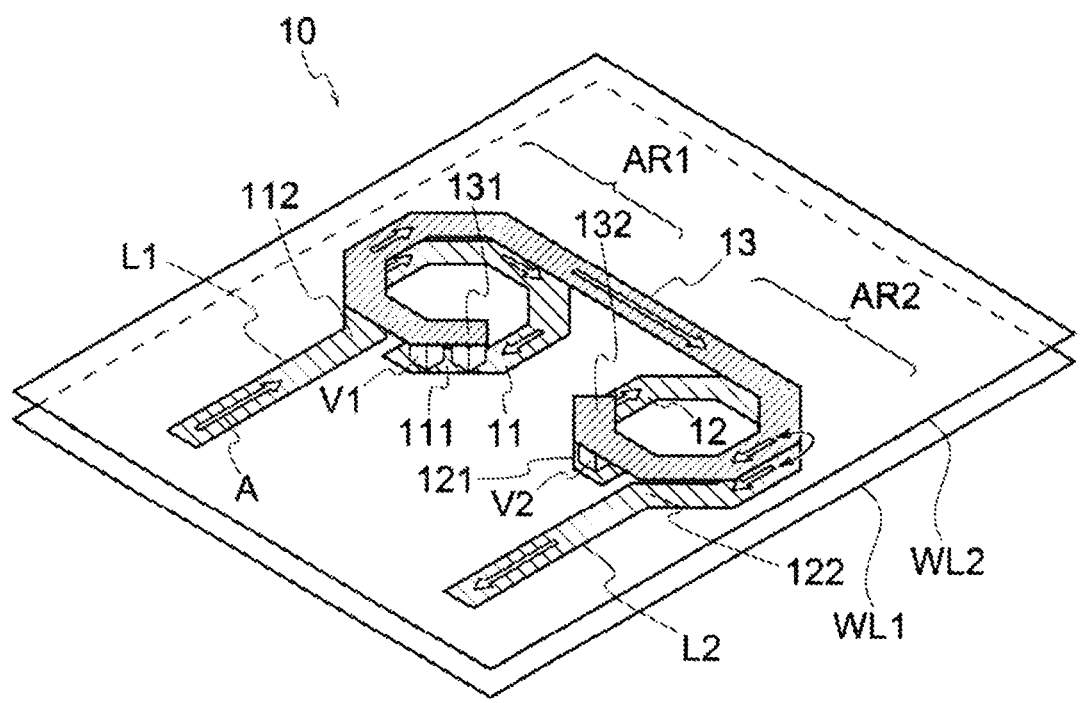
FIG. 7 is a perspective view illustrating a configuration of an inductor element according to a first embodiment.

FIG. 7 is a perspective view illustrating a configuration of the inductor element 10 according to the first embodiment. An arrow A in FIG. 7 illustrates an example of a direction of a current.

The inductor element 10 according to at least one embodiment includes a plurality of wiring layers (first wiring layer and second wiring layer) WL1 and WL2 stacked on the substrate (not illustrated). The wiring layers WL1 and WL2 are stacked so as to sandwich an insulating layer (not illustrated) therebetween.

The inductor element 10 includes an inductor portion (first inductor portion) 11, an inductor portion (second inductor portion) 12, an inductor portion (third inductor portion) 13, a via portion (first via) V1, and a via portion (second via) V2.

The inductor portion 11 is provided in a region AR1 of the wiring layer WL1. The inductor portion 11 has, for example, a single-layer winding coil (one-turn coil) in which a part thereof is formed of polygonal or annular wiring. The inductor portion 11 has one end (first end) 111 and another end (second end) 112. In the example illustrated in FIG. 7, the one end 111 of the inductor portion 11 is connected to the via portion V1, and the other end 112 of the inductor portion 11 is connected to the wiring L1. As the inductor portion 11, for example, a conductive material such as copper, aluminum, cobalt, or ruthenium may be used.

The inductor portion 12 is provided in a region AR2 different from the region AR1 of the wiring layer WL1. The regions AR1 and AR2 are arranged at intervals in the wiring layer WL1. The inductor portion 12 has, for example, a single-layer winding coil in which a part thereof is formed of polygonal or annular wiring. The inductor portion 12 has one end (first end) 121 and another end (second end) 122. In the example illustrated in FIG. 7, the one end 121 of the inductor portion 12 is connected to the via portion V2, and the other end 122 of the inductor portion 12 is connected to the wiring L2. A material of the inductor portion 12 may be the same as the material of the inductor portion 11, for example.

Figure 9A:
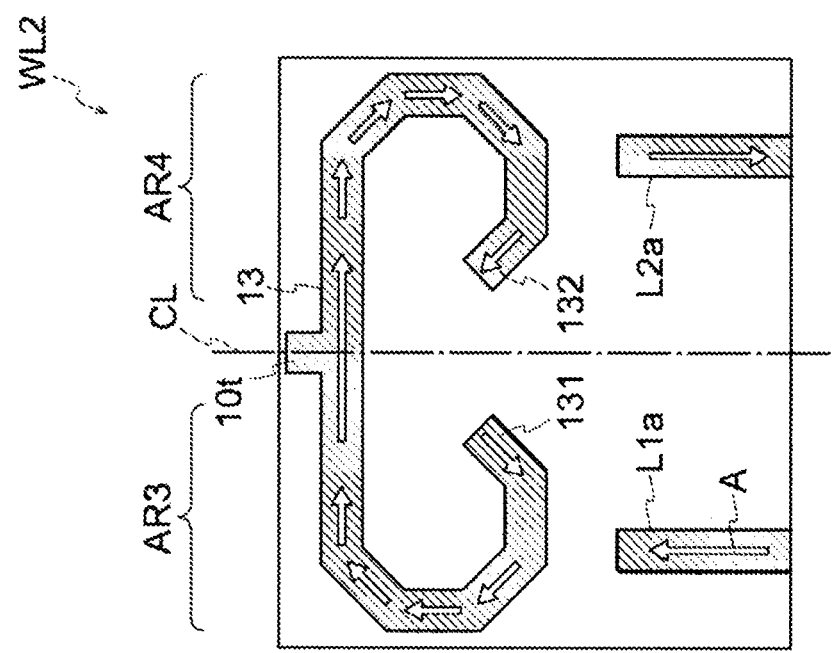
FIG. 9A is a diagram illustrating an inductor portion provided at a wiring layer WL1.
Figure 9B:
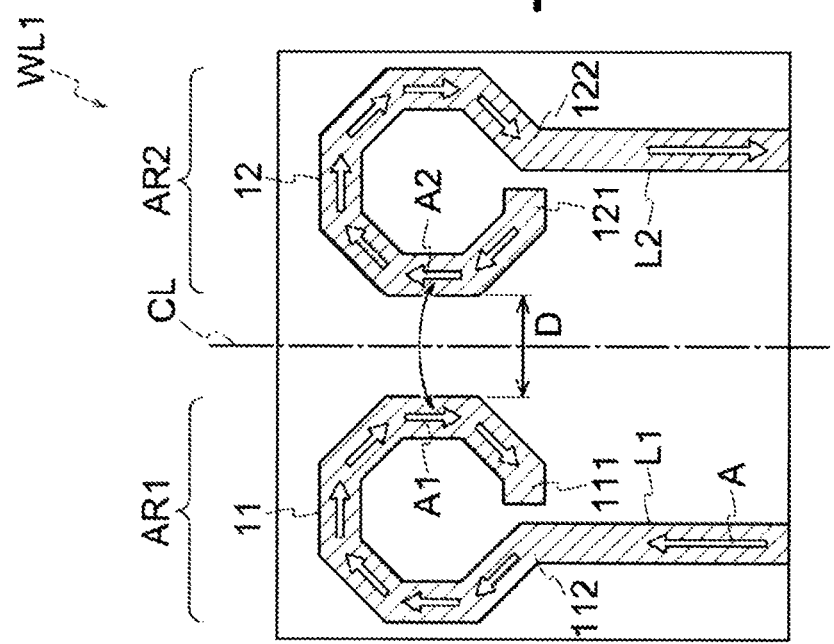
FIG. 9B is a diagram illustrating an inductor portion provided at a wiring layer WL2.

As illustrated in FIG. 9B, the inductor portion 13 is provided in regions AR3 and AR4 of the wiring layer WL2, which are separated from the wiring layer WL1 in a stacking direction. The regions AR3 and AR4 are not illustrated in FIG. 7, and are illustrated in FIG. 9B. The region AR3 is a region of the wiring layer WL2 corresponding to the region AR1 of the wiring layer WL1 when seen in the stacking direction. The region AR4 is a region of the wiring layer WL2 corresponding to the region AR2 of the wiring layer WL1 when seen in the stacking direction. The inductor portion 13 constitutes one inductor element 10 together with the inductor portion 11 and the inductor portion 12. The inductor portion 13 has an end portion 131 that is electrically connected to the one end 111 of the inductor portion 11 and an end portion 132 that is electrically connected to the one end 121 of the inductor portion 12. In the example illustrated in FIG. 7, the end portion 131 is connected to the via portion V1, and the end portion 132 is connected to the via portion V2. A material of the inductor portion 13 may be the same as the materials of the inductor portions 11 and 12, for example. The inductor portions 11 to 13 are, for example, wirings formed on or above the substrate.

More specifically, a part of the inductor portion 13 in the region AR3 of the wiring layer WL2 overlaps with a part of the inductor portion 11 when seen in the stacking direction. More specifically, the part of the inductor portion 13 that overlaps with the inductor portion 11 has, for example, polygonal shape or annular shape. Further, the inductor portion 13 in the region AR3 of the wiring layer WL2 magnetically couples with the inductor portion 11. That is, in the overlapping portion between the inductor portion 11 and the inductor portion 13, directions in which the current flows are substantially the same, and an inductance can be increased by a mutual inductance (that is, coupled so as to strengthen magnetic flux with each other). The overlapping portion of the inductor portion 13 extends the inductor portion 11 in the stacking direction and increase the number of windings. As a result, the inductance can be increased, and a Q value can be increased with a short line length. The Q value is one of parameters indicating antenna performance or quality of the inductor element 10. Details of the inductor element 10 when seen in the stacking direction will be described below with reference to FIGS. 8, 9A, and 9B.

Another part of the inductor portion 13 in the region AR4 of the wiring layer WL2 overlaps with a part of the inductor portion 12 when seen in the stacking direction. More specifically, the other part of the inductor portion 13 that overlaps with the inductor portion 12 has, for example, polygonal shape or annular shape. Further, the inductor portion 13 in the region AR4 of the wiring layer WL2 magnetically couples with the inductor portion 12. That is, in the overlapping portion between the inductor portion 12 and the inductor portion 13, directions in which the current flows are substantially the same, and an inductance can be increased by a mutual inductance. As illustrated in FIG. 7, the overlapping portion of the inductor portion 13 extends the inductor portion 12 in the stacking direction and increase the number of windings. As a result, the inductance can be increased, and the Q value can be increased with a short line length.

The via portion V1 extends in the stacking direction. The via portion V1 electrically connects the end portion 131 of the inductor portion 13 and the one end 111 of the inductor portion 11. Therefore, the via portion V1 connects the inductor portion 11 and the inductor portion 13 respectively provided at the different wiring layers WL1 and WL2. In the example illustrated in FIG. 7, the via portion V1 includes a plurality of (for example, two) via portions. Meanwhile, the number of via portions V1 is not limited to this. For example, the longer the overlapping distance between the inductor portion 11 and the inductor portion 13 is, and the more via portions V1 are provided, the more the resistance due to the via portion V1 can be reduced. As the via portion V1, for example, a conductive material such as tungsten or cobalt may be used.

The via portion V2 extends in the stacking direction. The via portion V2 electrically connects the end portion 132 of the inductor portion 13 and the one end 121 of the inductor portion 12. Therefore, the via portion V2 connects the inductor portion 12 and the inductor portion 13 respectively provided at the different wiring layers WL1 and WL2. The number of via portions V2 may be the same as the number of via portions V1. A material of the via portion V2 may be the same as a material of the via portion V1, for example.

A wiring layer L1 in FIG. 7 is connected to one end of the first resistance element 45 in FIG. 4, and a wiring layer L2 is connected to one end of the second resistance element 46 in FIG. 4. The first inductor element 43 in FIG. 4 is configured with the inductor portion 11 and the inductor portion 13 of the region AR3. Further, the second inductor element 44 in FIG. 4 is configured with the inductor portion 12 and the inductor portion 13 of the fourth region AR4. The inductor portion 13 is electrically conducted with the power supply voltage node.

Figure 8:
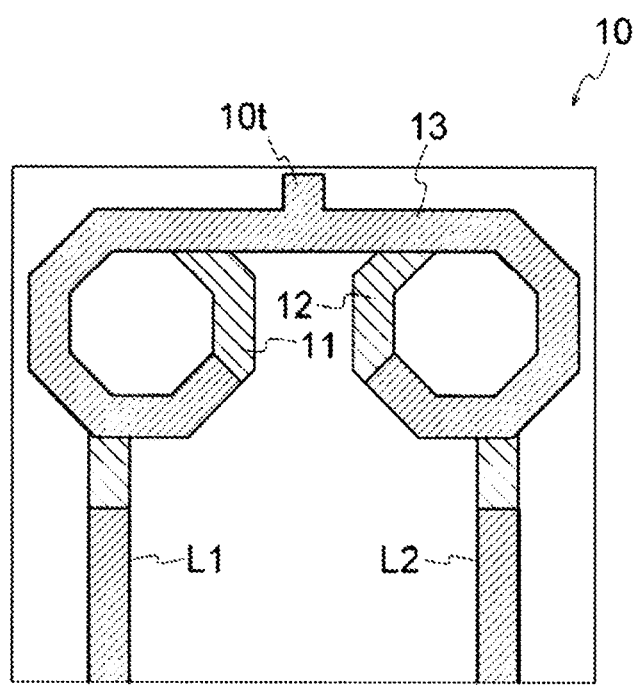
FIG. 8 is a plan view illustrating the configuration of the inductor element according to the first embodiment.

FIG. 8 is a plan view illustrating a configuration of the inductor element 10 according to the first embodiment.

As illustrated in FIG. 8, when seen in the stacking direction, a part of the inductor portion 11 and a part of the inductor portion 13 overlap with each other so as to form a winding, and a part of the inductor portion 12 and a part of the inductor portion 13 overlap with each other so as to form a winding. An end portion 10t is provided in a part of the inductor portion 13.

FIGS. 9A and 9B are plan views illustrating the inductor element 10 in FIG. 8 divided for each of the wiring layers WL1 and WL2. FIG. 9A illustrates the inductor portions 11 and 12 provided at the wiring layer WL1. FIG. 9B illustrates the inductor portion 13 provided at the wiring layer WL2. The wirings L1 and L2 illustrated in FIG. 9A are connected to wirings L1a and L2a illustrated in FIG. 9B by vias (not illustrated) or the like.

One end of the inductor element 10 connected to the wiring L1 corresponds to the other end 112 of the inductor portion 11, and the other end of the inductor element 10 connected to the wiring L2 corresponds to the other end 122 of the inductor portion 12.

In the example illustrated in FIGS. 9A and 9B, as illustrated by the arrow A, a resonance current flows in this order of the wiring L1, the other end 112 and the one end 111 of the inductor portion 11, the end portion 131 and the end portion 132 of the inductor portion 13, and the one end 121 and the other end 122 of the inductor portion 12, and the wiring L2.

As illustrated in FIG. 9A, the inductor portion 11 and the inductor portion 12 are provided symmetrically with respect to a center line CL of the inductor portion 11 and the inductor portion 12, when seen in the stacking direction. That is, the inductor portion 11 and the inductor portion 12 have a symmetrical shape (mirror symmetry or line symmetry with respect to the center line CL). Here, the center line CL is a virtual line.

As illustrated in FIG. 9B, the inductor portion 13 is substantially symmetrical with respect to the center line CL, when seen in the stacking direction. That is, the inductor portion 13 has a substantially symmetrical shape.

Further, as illustrated in FIG. 9B, the end portion 10*t* is provided at a certain position of the inductor portion 13. More specifically, the end portion 10*t* is provided at the center line CL of the inductor portion 13. As described above, the higher the symmetry of the inductor element 10, the more the symmetry of the differential signal waveform can be ensured, and the further common mode noise generated due to a delay or asymmetry of a waveform can be reduced.

As illustrated by arrows A1 and A2 in FIG. 9A, at a position at which the inductor portion 11 and the inductor portion 12 are closest to each other, a direction of a current flowing through the inductor portion 11 and a direction of a current flowing through the inductor portion 12 are opposite to each other. Therefore, between the inductor portion 11 and the inductor portion 12, a magnetic field generated by the inductor portion 11 and a magnetic field generated by the inductor portion 12 weaken each other. As a separation distance D between the inductor portion 11 and the inductor portion 12 increases, an inductance of the inductor element 10 increases and the Q value increases. Meanwhile, the larger the separation distance D, the larger the occupied area of the inductor element 10. Therefore, the separation distance D may be set to be within a range satisfying the required characteristics.

FIG. 10 is a graph illustrating an example of a relationship between the Q value and an occupied area. In FIG. 10, a vertical axis represents the Q value, and a horizontal axis represents the occupied area. FIG. 10 illustrates a result of an electromagnetic field simulation. Further, FIG. 10 illustrates an example of data related to an inductor used in a 28 GHz oscillation circuit. Triangular data points indicate data of the inductor element 10 according to the first embodiment. Circular data points indicate data of a two-winding differential spiral inductor in the same wiring layer. Quadrangular data points indicate data of a one-winding inductor. Further, in the example illustrated in FIG. 10, five triangular data points are plotted. This is because the simulation is performed by changing a condition such as a diameter of a coil portion of the inductor, a wiring width, and the separation distance D. Four circular data points are also simulated and plotted by changing each condition. In addition, three quadrangular data points are also simulated and plotted by changing each condition.

As illustrated in FIG. 10, the inductor element 10 according to the first embodiment can reduce the occupied area while maintaining the Q value, as compared with the two-winding differential spiral inductor and the one-winding inductor. The Q value is preferably equal to or more than 10, for example.

As described above, in the CTLE 60 according to the first embodiment, the first circuit including the first differential transistor pair 41, the first inductor element 43, the second inductor element 44, the first resistance element 45, the second resistance element 46, the first current source 49, and the second current source 50 can improve a gain of a specific frequency bandwidth, and the second circuit including the second differential transistor pair 42, the first inductor element 43, the second inductor element 44, the first resistance element 45, the second resistance element 46, the third current source 51, and the fourth current source 52 can further improve the gain of the specific frequency bandwidth. Further, by using the inductor elements 10 illustrated in FIGS. 7 to 10 as the first inductor element 43 and the second inductor element 44, the first inductor element 43 and the second inductor element 44 can be miniaturized, and symmetry between the first inductor element 43 and the second inductor element 44 can be improved.

More specifically, the inductor portions 11 and 12 in the inductor element 10 illustrated in FIGS. 7 to 10 are provided at the wiring layer WL1, and the inductor portion 13 is provided at the wiring layer WL2 to be separated from the wiring layer WL1 in the stacking direction. Further, the end portion 131 of the inductor portion 13 is electrically connected to the one end 111 of the inductor portion 11, and the end portion 132 of the inductor portion 13 is electrically connected to the one end 121 of the inductor portion 12. That is, one inductor element 10 is configured with the inductor portions 11, 12, and 13. With such a configuration, the inductor element 10 according to the first embodiment can reduce the occupied area while maintaining the Q value.

By reducing the occupied area of the inductor element 10, a chip cost can be reduced. In addition, a turn around time (TAT) can be reduced by facilitating placement. Further, interference between the inductor element 10 and another package or another substrate wiring can be reduced. This is because by reducing the area of the inductor element 10, an influence of a magnetic field generated by a current flowing through the substrate wiring or the like can be reduced.

Further, a shape of the inductor element 10 can be made rectangular when seen in the stacking direction. As a result, for example, the degree of freedom of arrangement with respect to other components such as a pad for wire bonding can be improved.

A differential spiral inductor may be used as an inductor element for the CTLE 60. In the two-winding differential spiral inductor in the same wiring layer, a high inductance can be obtained by a mutual inductance of a wiring on the outer peripheral side and a wiring on the inner peripheral side. Meanwhile, in this configuration, a parasitic capacitance between wires (between windings) in an in-plane direction (direction perpendicular to the stacking direction) tends to be large. If the parasitic capacitance is large, the inductance will decrease and the Q value will decrease. In addition, since an area of the wiring portion in the in-plane direction becomes large, the parasitic capacitance between the substrate and the wiring in the upper and lower layers becomes high. As a result, the Q value becomes small. Further, a voltage is changed, between one end and the other end of the inductor element. In the two-winding differential spiral inductor, a voltage difference between the wirings that generate the mutual inductance becomes large, and the parasitic capacitance may become large. The Q value also becomes small due to such a factor. The wirings in the in-plane direction that causes the mutual inductance are magnetically coupled according to a thickness of the wiring.

In contrast, in the inductor element 10 according to the first embodiment, as illustrated in FIG. 8, in the stacking direction, a part of the inductor portion 11 and a part of the inductor portion 13 overlap with each other, and a part of the inductor portion 12 and a part of the inductor portion 13 overlap with each other. That is, an area of the wiring portion in the in-plane direction is small. As a result, the parasitic capacitance in the stacking direction via the substrate is reduced at the portion of the inductor portion 13 that overlaps with the inductor portion 11. Further, since each of the inductor portions 11 to 13 is wound once in the in-plane direction, the parasitic capacitance in the in-plane direction is small. Further, since the overlapping portion between the inductor portion 11 and the inductor portion 13 is on the region AR1 side of the wiring of the inductor element 10, a voltage difference of the overlapping portion is small and the parasitic capacitance is small. The same applies to the overlapping portion between the inductor portion 12 and the inductor portion 13 on the region AR2 side. In general, a width of the wiring is larger than a thickness of the wiring, so that the coupling of the inductors in the stacking direction is stronger than the coupling of the inductors in the in-plane direction. Therefore, a larger inductance can be obtained by the overlapping in the stacking direction. As described above, since the inductor element 10 according to the first embodiment has the small parasitic capacitance and the large inductance, the occupied area can be reduced while maintaining the high Q value.

Although the inductor portions 11 to 13 described above are provided at the two wiring layers WL1 and WL2, the present disclosure is not limited to this, and the inductor portions 11 to 13 may be provided at three or more wiring layers. For example, an inductor portion having a polygonal shape or an annular shape in the same manner as the inductor portions 11 and 12 can be provided in at least one intermediate wiring layer between the wiring layer provided with the inductor portions 11 and 12 and the wiring layer provided with the inductor portion 13. The inductor portion of the intermediate wiring layer is also connected to the inductor portions 11 to 13 via a via portion to constitute one inductor element 10. As a result, the inductance can be further improved. In addition, the occupied area can be reduced without significantly reducing the inductance. The inductor portion 13 may not be provided with the overlapping portion with the inductor portion of the adjacent wiring layer depending on a position of the via portion.

Second Embodiment

A reception circuit 28a according to a second embodiment includes a CTLE 60a. A circuit configuration of the CTLE 60a is different from the circuit configuration of the CTLE 60 according to the first embodiment.

Figure 11:
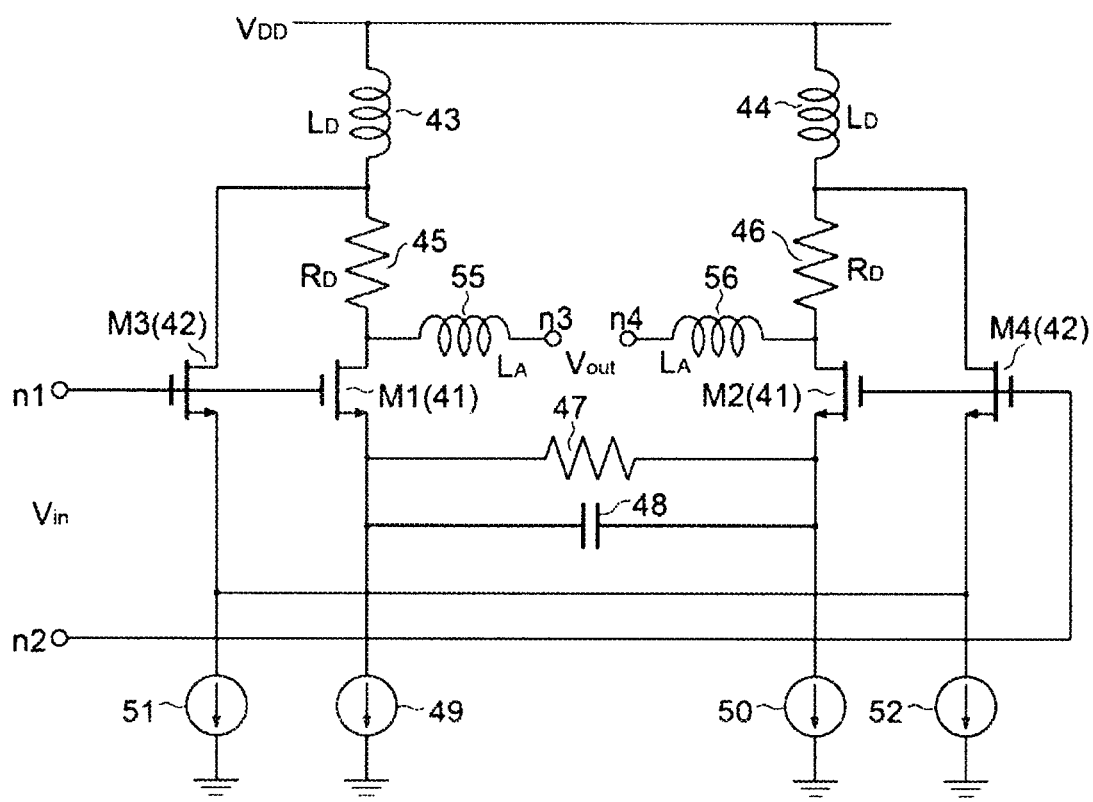
FIG. 11 is a circuit diagram of a CTLE in a reception device according to a second embodiment.

FIG. 11 is a circuit diagram of the CTLE 60a in the reception circuit 28a according to the second embodiment. The CTLE 60a in FIG. 11 includes a third inductor element 55 and a fourth inductor element 56, in addition to the circuit configuration of the CTLE 60 according to the first embodiment. The third inductor element 55 is connected between the third node n3 that outputs a third signal, which is one of the differential output signal $V_{out}$, and a drain of the first transistor M1. The fourth inductor element 56 is connected between the fourth node n4 that outputs a fourth signal, which is the other of the differential output signal $V_{out}$, and a drain of the second transistor M2.

In the same manner as the CTLE 60, the CTLE 60a in FIG. 11 has a symmetrical circuit configuration between the first transistor M1 and the second transistor M2 facing each other. Inductances of the third inductor element 55 and the fourth inductor element 56 have the same value $L_A$. Therefore, in the following, a circuit configuration of a circuit on one side of the CTLE 60a (hereinafter, a CTLE half circuit 60ah) will be described.

Figure 12:
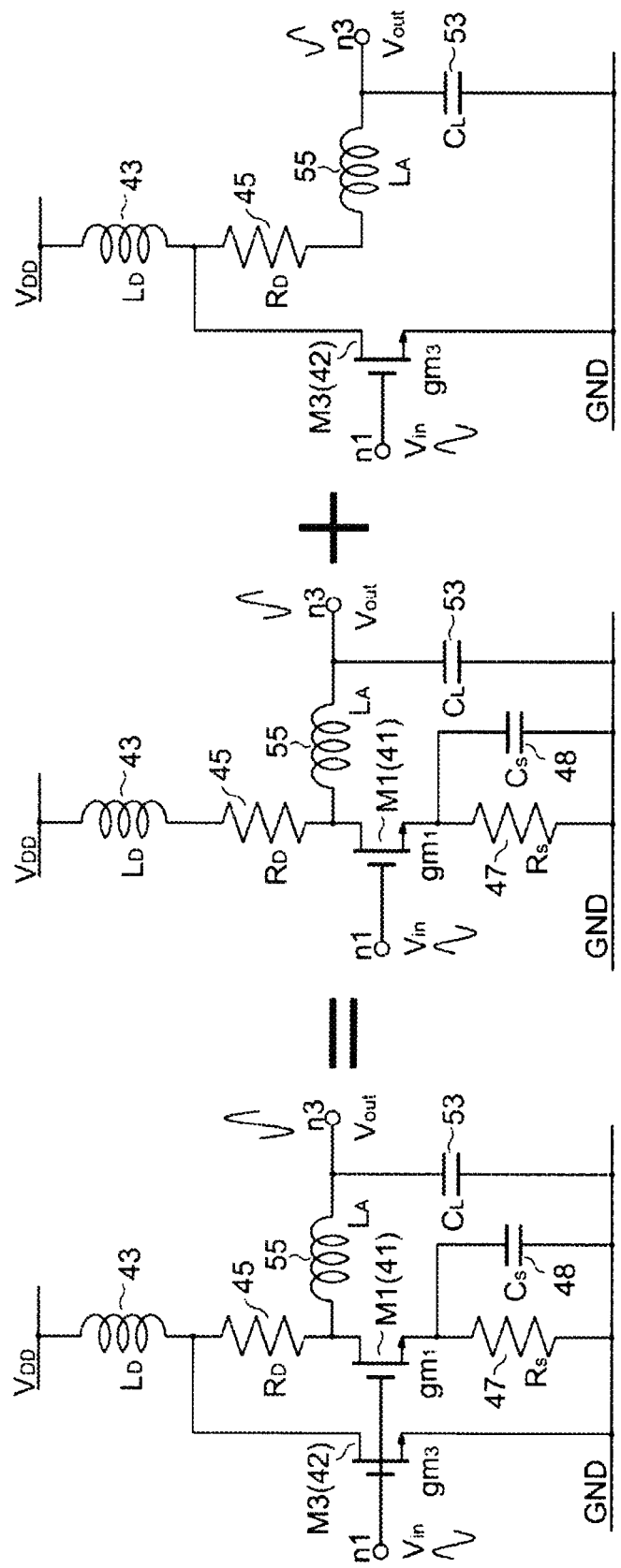
FIG. 12 is an equivalent circuit diagram of a CTLE half circuit according to the second embodiment.

FIG. 12 is an equivalent circuit diagram of the CTLE half circuit 60ah according to the second embodiment. As illustrated in FIG. 12, the CTLE half circuit 60ah according to the second embodiment is equivalently configured with a first half circuit 61ah and a second half circuit 62ah.

The CTLE half circuit 60ah in FIG. 12 includes, in addition to the circuit configuration of the CTLE half circuit 60h in FIG. 5, the third inductor element 55 connected between the third node n3 that outputs the third signal, which is one of the differential output signals $V_{out}$, and the drain of the first transistor M1. In the same manner, the first half circuit 61ah in FIG. 12 has the third inductor element 55, in addition to the circuit configuration of the first half circuit 61h in FIG. 5. In the same manner, the second half circuit 62ah in FIG. 12 has the third inductor element 55, in addition to the circuit configuration of the second half circuit 62h in FIG. 5.

The gain $Av_{FF\text{-}CTLE}$ of the CTLE 60a according to the second embodiment is $Av_{FF\text{-}CTLE}=Av_{FF}+Av_{CTLE}$, in the same manner as the CTLE 60 in FIG. 5. The gain $Av_{CTLE}$ of the first half circuit 61ah according to the second embodiment is expressed by the following equation (3).

$$Av_{CTLE} = gm_1 \cdot \frac{1+sR_sC_s}{(1+gm_1R_s)+sR_sC_s} \cdot \frac{R_D+sL_D}{1+sR_DC_L+s^2(L_D+L_A)C_L} \quad (3)$$

The gain $Av_{FF}$ of the second half circuit 62ah is expressed by the following equation (4) using the transfer function.

$$Av_{FF} = gm_3 \cdot \frac{sL_D}{1+s(R_D+sL_A)C_L+s^2L_DC_L} \quad (4)$$

Figure 13:
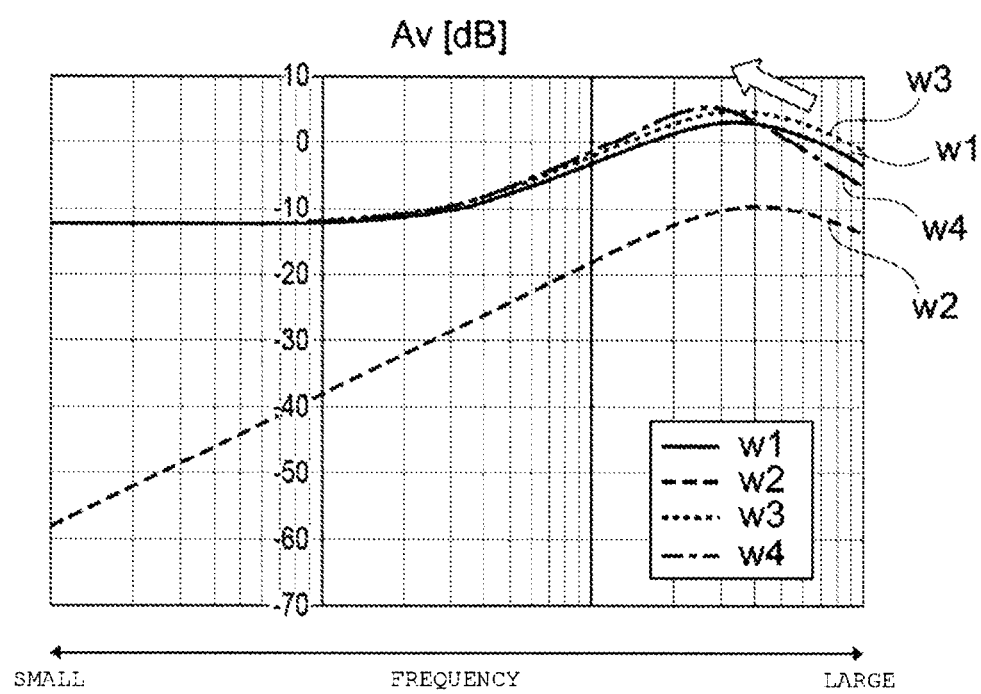
FIG. 13 is a diagram illustrating gain characteristics of the CTLE half circuit, a first half circuit, and a second half circuit.

FIG. 13 is a diagram illustrating gain characteristics of the CTLE half circuit 60ah, the first half circuit 61ah, and the second half circuit 62ah configured as illustrated in FIG. 12. Characteristics illustrated by the waveforms w1 to w3 in FIG. 13 are the same as the characteristics in the waveforms w1 to w3 in FIG. 6. That is, the waveform w3 in FIG. 13 illustrates the gain characteristic of the CTLE 60a in FIG. 6. The waveform w4 in FIG. 13 illustrates the gain characteristic of the CTLE 60a in FIG. 12.

As can be seen by comparing the waveforms w3 and w4 in FIG. 13, by respectively connecting the third inductor element 55 and the fourth inductor element 56 to the third node n3 and the fourth node n4, a gain of a certain frequency bandwidth can be further increased.

In the second embodiment as well, the first inductor element 43 and the second inductor element 44 may be configured with the inductor element 10 having the same structure as the structure in FIGS. 7 to 10 in the same manner as the first embodiment. Further, the third inductor element 55 and the fourth inductor element 56 may be arranged on a wiring layer different from the wiring layers WL1 and WL2.

Figure 14:
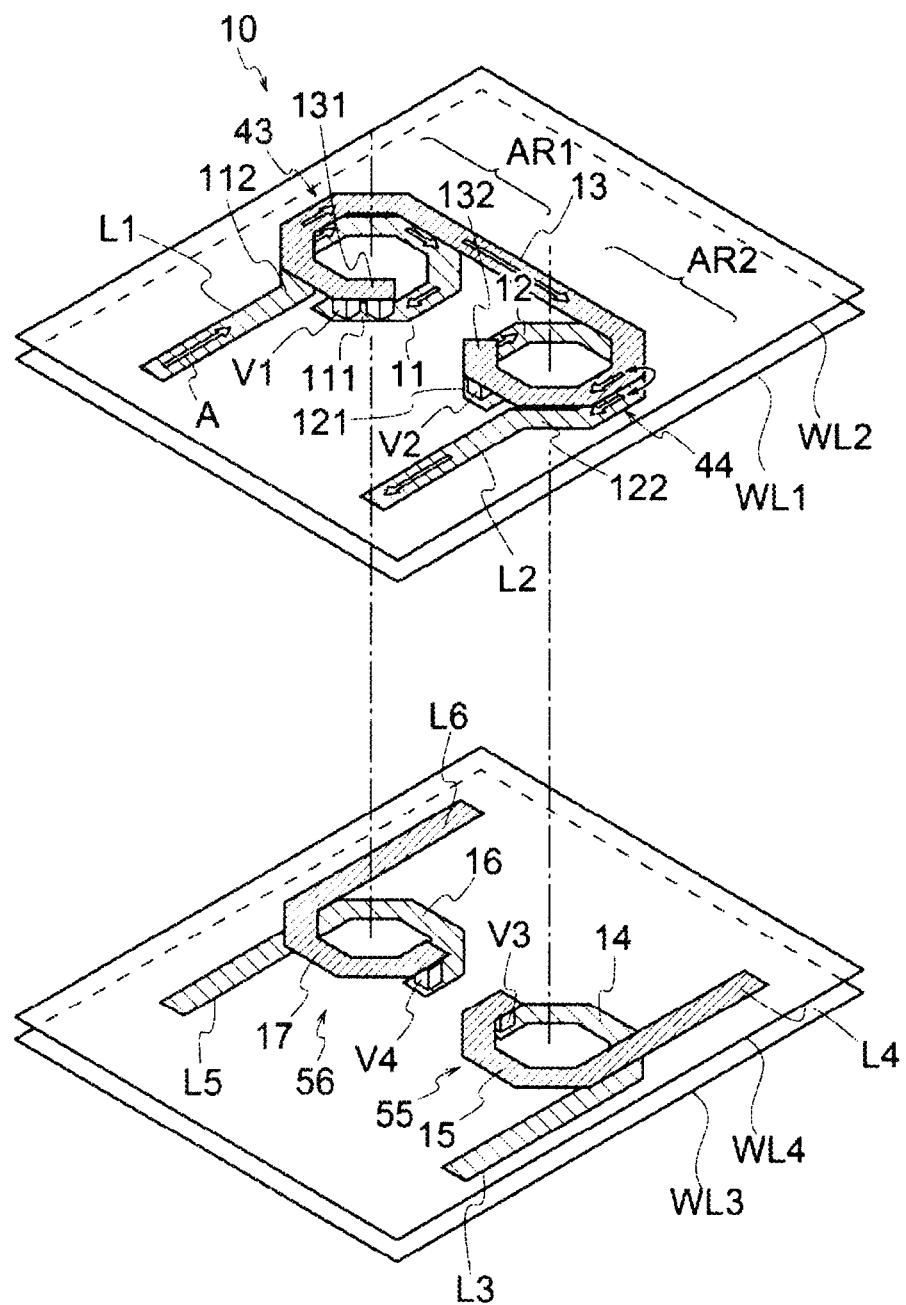
FIG. 14 is a perspective view illustrating a configuration of a third inductor element and a fourth inductor element according to the second embodiment.

FIG. 14 is a perspective view illustrating a configuration of the third inductor element 55 and the fourth inductor element 56 according to the second embodiment. In FIG. 14, the third inductor element 55 and the fourth inductor element 56 are arranged in a wiring layer (third wiring layer) WL3 and a wiring layer (fourth wiring layer) WL4. The wiring layers WL3 and WL4 are arranged at a position at which the wiring layers WL3 and WL4 are stacked on the wiring layers WL1 and WL2.

The third inductor element 55 has an inductor portion (fourth inductor portion) 14 disposed at the wiring layer WL3 and an inductor portion (fifth inductor portion) 15 disposed at the wiring layer WL4. In the wiring layer WL3, a part of the inductor portion 14 is formed in a polygonal line or a curved shape. The inductor portion 14 has one end and the other end. One end of the inductor portion 14 is connected to a via portion V3, and the other end of the inductor portion 14 is connected to a wiring L3. The wiring L3 is connected to the drain of the first transistor M1 in FIG.

11. A material of the inductor portion 14 may be the same as the materials of the inductor portions 11, 12, and 13 described above.

In the wiring layer WL4, a part of the inductor portion 15 is formed in a polygonal line or a curved shape. The inductor portion 15 has one end and the other end. One end of the inductor portion 15 is connected to the via portion V3, so that the inductor portion 14 and the inductor portion 15 are electrically connected. The other end of the inductor portion 15 is conducted to a wiring L4. The wiring L4 is connected to the third node n3 in FIG. 11. A material of the inductor portion 15 may be the same as the materials of the inductor portions 11, 12, 13, and 14 described above. When seen in the stacking direction, at least a part of the inductor portion 14 and a part of the inductor portion 15 overlap with each other, and the overlapping portion of the inductor portions 14 and 15 is arranged in a polygonal shape or an annular shape.

In the same manner, the fourth inductor element 56 has an inductor portion (sixth inductor portion) 16 disposed at the wiring layer WL3 and an inductor portion (seventh inductor portion) 17 disposed at the wiring layer WL4. In the wiring layer WL3, a part of the inductor portion 16 is formed in a polygonal line or a curved shape. The inductor portion 16 has one end and the other end. One end of the inductor portion 16 is connected to a via portion V4, and the other end of the inductor portion 16 is connected to a wiring L5. The wiring L5 is connected to the drain of the second transistor M2 in FIG. 11. A material of the inductor portion 16 may be the same as the materials of the inductor portions 11 to 15 described above.

In the wiring layer WL4, a part of the inductor portion 17 is formed in a polygonal line or a curved shape. The inductor portion 17 has one end and the other end. One end of the inductor portion 17 is connected to the via portion V4, so that the inductor portion 16 and the inductor portion 17 are electrically conducted. The other end of the inductor portion 17 is connected to a wiring L6. The wiring L6 is connected to the fourth node n4 in FIG. 11. A material of the inductor portion 17 may be the same as the materials of the inductor portions 11 to 16 described above. When seen in the stacking direction, at least a part of the inductor portion 16 and a part of the inductor portion 17 overlap with each other, and the overlapping portion of the inductor portions 16 and 17 is arranged in a polygonal shape or an annular shape.

In at least one embodiment, when seen in the stacking direction, a polygonal portion or annular portion of the third inductor element 55 overlaps with a polygonal portion or annular portion of the second inductor element 44, and a polygonal portion or annular portion of the fourth inductor element 56 overlaps with a polygonal portion or annular portion of the first inductor element 43. As a result, the third inductor element 55 and the second inductor element 44 can overlap with each other, and the fourth inductor element 56 and the first inductor element 43 can overlap with each other. Therefore, the occupied areas of the first to fourth inductor elements 43, 44, 55, and 56 can be reduced. It is noted that as illustrated in FIG. 11, the third inductor element 55 and the second inductor element 44 are provided at CTLE half circuits different from each other. In the same manner, the fourth inductor element 56 and the first inductor element 43 are provided at CTLE half circuits different from each other. In this manner, the reason why the two inductor elements (55 and 44) or (56 and 43) in the CTLE half circuits different from each other overlap with each other is to cause inductive coupling and increase a signal intensity. For example, if the third inductor element 55 and the first inductor element 43 overlap with each other, or if the fourth inductor element 56 and the second inductor element 44 overlap with each other, it is not desirable since the inductive coupling is less likely to occur and the signal intensity does not increase.

FIGS. 15A and 15B are diagrams illustrating transient characteristics (Trans characteristics) of the CTLE 60a according to the second embodiment. FIG. 15A is a characteristic diagram when a gain of a specific frequency is raised by 10 dB by the equalizer 31 for a signal passing through a transmission line having a loss of 10 dB (referred to as VSR assumption). FIG. 15B is a characteristic diagram when the gain of the specific frequency is raised by 15 dB by the equalizer 31 for a signal passing through a transmission line having a loss of 30 dB (LR assumption).

Transient response waveforms are illustrated on the left side of each of FIGS. 15A and 15B. The thick solid line illustrates the transient response waveform of CTLE 60a according to the second embodiment, and the fine solid line illustrates the transient response waveform of CTLE according to one comparative example. In the CTLE according to the comparative example, a circuit configuration is the same as the circuit configuration in FIG. 4, and the first inductor element 43 and the second inductor element 44 without using the inductor element 10 are respectively used as individual elements. That is, as illustrated in FIG. 14, the thick solid line indicates a transient response characteristic of the CTLE 60a according to the second embodiment, in which the first inductor element 43 and the fourth inductor element 56 overlap with each other in the stacking direction, and the second inductor element 44 and the third inductor element 55 overlap with each other in the stacking direction. On the other hand, the fine solid line illustrates a transient response characteristic when the first to fourth inductor elements 43, 44, 55, and 56 illustrated in FIG. 14 are respectively used as individual elements without using the inductor element 10. There is a difference in a peak part and a bottom part of the waveform between the fine solid line and the fine solid line.

In FIGS. 15A and 15B, an upper right corner of each thereof illustrates an eye pattern of an output signal of the CTLE according to the comparative example, and a lower right corner of each thereof illustrates an eye pattern of an output signal of the CTLE 60a according to the second embodiment.

Although the CTLE 60a according to the second embodiment does not indicate a significant difference in the transient response waveform as compared with the CTLE according to the comparative example, there is a noticeable difference in the eye pattern, as can be seen from FIGS. 15A and 15B.

Specifically, as can be seen from FIG. 15A, an opening amount increases in both a voltage direction and a time direction, and from FIG. 15B, the opening amount in the voltage direction increases. Therefore, as illustrated in FIG. 14, the first inductor element 43 and the fourth inductor element 56 overlap with each other in the stacking direction, and the second inductor element 44 and the third inductor element 55 overlap with each other in the stacking direction, so that the transient characteristics can be further improved.

As described above, in the second embodiment, the third inductor element 55 is connected between the third node n3 from which one of the differential output signals $V_{out}$ of the CTLE 60a is output and the drain of the first transistor M1, and the fourth inductor element 56 is connected between the fourth node n4 from which the other of the dynamic output signals $V_{out}$ is output and the drain of the second transistor M2, so that a gain in a certain frequency bandwidth on the high frequency side of the CTLE 60a can be further improved. Further, for example, a polygonal or annular inductor portion is provided in at least a part of each of the third inductor element 55 and the fourth inductor element 56 as illustrated in FIG. 14, and the polygonal portion or annular portion of the third inductor element 55 overlaps with the polygonal portion or annular portion of the second inductor element 44 in the stacking direction and the polygonal portion or annular portion of the fourth inductor element 56 overlaps with the polygonal portion or annular portion of the first inductor element 43 in the stacking direction. As a result, the occupied areas of the first to fourth inductor elements 43, 44, 55, and 56 can be reduced.

The present embodiment can be summarized as follows.

APPENDIX 1

A semiconductor integrated circuit including:
a substrate including a first wiring layer and a second wiring layer that is separated from the first wiring layer in a stacking direction;
an equalization circuit formed on the substrate to amplify a signal level of a part of a frequency bandwidth included in a differential input signal including a first signal and a second signal having logics opposite to each other, and output a differential output signal including a third signal and a fourth signal;
a first node to which the first signal is input;
a second node to which the second signal is input;
a third node from which the third signal is output; and
a fourth node from which the fourth signal is output,
in which the equalization circuit includes
a first transistor having a gate connected to the first node and a drain connected to the third node,
a first inductor element and a first resistance element connected in series between the drain of the first transistor and a first reference voltage node,
a second transistor having a gate connected to the second node and a drain connected to the fourth node, and
a second inductor element and a second resistance element connected in series between the drain of the second transistor and the first reference voltage node,
each of the first inductor element and the second inductor element is a part of a synthetic inductor element having a first inductor portion, a second inductor portion, and a third inductor portion,
the first inductor portion is provided in a first region of the first wiring layer, has a first end portion, and includes a single-layer winding coil,
the second inductor portion is provided in a second region of the first wiring layer, which is different from the first region, has a second end portion, and includes a single-layer winding coil,
the third inductor portion is provided at the second wiring layer, and has a third end portion and a fourth end portion, and
the third end portion of the third inductor portion is electrically connected to the first end portion of the first inductor portion, and the fourth end portion of the third inductor portion is electrically connected to the second end portion of the second inductor portion.

APPENDIX 2

The semiconductor integrated circuit according to appendix 1,
in which the equalization circuit further includes
a first via that extends in the stacking direction, and electrically connects the third end portion of the third inductor portion and the first end portion of the first inductor portion, and
a second via that extends in the stacking direction, and electrically connects the fourth end portion of the third inductor portion and the second end portion of the second inductor portion.

APPENDIX 3

The semiconductor integrated circuit according to appendix 1 or 2,
in which when seen in the stacking direction, the third inductor portion in a third region of the second wiring layer overlaps with at least a part of the first inductor portion in the first region of the first wiring layer, and
when seen in the stacking direction, the third inductor portion in a fourth region of the second wiring layer overlaps with at least a part of the second inductor portion in the second region of the first wiring layer.

APPENDIX 4

The semiconductor integrated circuit according to appendix 1 or 2,
in which the first inductor element includes the first inductor portion and a first portion of the third inductor portion, and
the second inductor element includes the second inductor portion and a second portion of the third inductor portion.

APPENDIX 5

The semiconductor integrated circuit according to appendix 4,
in which the first inductor portion overlaps with at least a part of the first portion of the third inductor portion, when seen in the stacking direction, and
the second inductor portion overlaps with at least a part of the second portion of the third inductor portion, when seen in the stacking direction.

APPENDIX 6

The semiconductor integrated circuit according to any one of appendixes 1 to 5,
in which the equalization circuit includes
a third transistor having a gate connected to the first node, and a drain connected to a connection node of the first inductor element and the first resistance element, and
a fourth transistor having a gate connected to the second node, and a drain connected to a connection node of the second inductor element and the second resistance element.

APPENDIX 7

The semiconductor integrated circuit according to appendix 6,
in which the equalization circuit includes
a first current source connected between a source of the first transistor and a second reference voltage node having a voltage different from a voltage of the first reference voltage node, and a second current source connected between a source of the second transistor and the second reference voltage node, and having the same circuit configuration as the circuit configuration of the first current source.

APPENDIX 8

The semiconductor integrated circuit according to any one of appendixes 1 to 7,
in which an inductance of the first inductor element is equal to an inductance of the second inductor element, and a resistance value of the first resistance element is equal to a resistance value of the second resistance element.

APPENDIX 9

The semiconductor integrated circuit according to any one of appendixes 1 to 8,
in which the equalization circuit includes
a third inductor element connected between the third node and the drain of the first transistor, and
a fourth inductor element connected between the fourth node and the drain of the second transistor.

APPENDIX 10

The semiconductor integrated circuit according to appendix 9,
in which when seen in the stacking direction, the third inductor element overlaps with at least a part of the second inductor element, and
when seen in the stacking direction, the fourth inductor element overlaps with at least a part of the first inductor element.

APPENDIX 11

The semiconductor integrated circuit according to appendix 9 or 10,
in which the substrate further includes a third wiring layer, and a fourth wiring layer that is separated from the third wiring layer in the stacking direction,
the third inductor element includes
a fourth inductor portion provided in a fifth region of the third wiring layer, and
a fifth inductor portion provided at the fourth wiring layer, and electrically connected to the fourth inductor portion, and
the fourth inductor element includes
a sixth inductor portion provided in a sixth region of the third wiring layer, which is different from the fifth region, and
a seventh inductor portion provided at the fourth wiring layer, and electrically connected to the sixth inductor portion.

APPENDIX 12

The semiconductor integrated circuit according to appendix 11,
in which the fourth inductor portion overlaps with at least a part of the fifth inductor portion, when seen in the stacking direction, and
the sixth inductor portion overlaps with at least a part of the seventh inductor portion, when seen in the stacking direction.

APPENDIX 13

The semiconductor integrated circuit according to appendix 12,
in which the first inductor portion overlaps with at least a part of each of the third inductor portion, the sixth inductor portion, and the seventh inductor portion, when seen in the stacking direction, and
the second inductor portion overlaps with at least a part of each of the third inductor portion, the fourth inductor portion, and the fifth inductor portion, when seen in the stacking direction.

APPENDIX 14

A reception device including:
the semiconductor integrated circuit according to any one of appendixes 1 to 13; and
an A/D converter circuit that converts an output signal of the equalization circuit included in the semiconductor integrated circuit into a digital signal.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A semiconductor integrated circuit comprising:
a substrate including a first wiring layer and a second wiring layer, the second wiring layer separated from the first wiring layer in a stacking direction;
an equalization circuit disposed on the substrate and configured to amplify a signal level of a part of a frequency bandwidth included in a differential input signal, the differential input signal including a first signal and a second signal having logics opposite to each other, and configured to output a differential output signal including a third signal and a fourth signal, the third signal corresponding to the first signal and the fourth signal corresponding to the second signal;
a first node to which the first signal is input;
a second node to which the second signal is input;
a third node from which the third signal is output; and
a fourth node from which the fourth signal is output,
wherein the equalization circuit includes:
a first transistor having a gate connected to the first node and a drain connected to the third node,
a first inductor element and a first resistance element connected in series between the drain of the first transistor and a first reference voltage node,
a second transistor having a gate connected to the second node and a drain connected to the fourth node, and
a second inductor element and a second resistance element connected in series between the drain of the second transistor and the first reference voltage node,
wherein each of the first inductor element and the second inductor element is a part of a synthetic inductor element, the synthetic inductor element having a first inductor portion, a second inductor portion, and a third inductor portion, the first inductor portion is disposed in a first region of the first wiring layer, has a first end portion, and includes a single-layer winding coil, the second inductor portion is disposed in a second region of the first wiring layer, the second region being different from the first region, the second inductor portion has a second end portion, and includes a single-layer winding coil, the third inductor portion is disposed at the second wiring layer, and has a third end portion and a fourth end portion, and the third end portion of the third inductor portion is electrically connected to the first end portion of the first inductor portion, and the fourth end portion of the third inductor portion is electrically connected to the second end portion of the second inductor portion, wherein the equalization circuit includes:

a third transistor having a gate connected to the first node, and a drain connected to a connection node of the first inductor element and the first resistance element, and a fourth transistor having a gate connected to the second node, and a drain connected to a connection node of the second inductor element and the second resistance element.

2. The semiconductor integrated circuit according to claim 1, wherein when seen in the stacking direction, the third inductor portion in a third region of the second wiring layer overlaps with at least a part of the first inductor portion in the first region of the first wiring layer, and when seen in the stacking direction, the third inductor portion in a fourth region of the second wiring layer overlaps with at least a part of the second inductor portion in the second region of the first wiring layer.

3. The semiconductor integrated circuit according to claim 1, wherein the first inductor element includes the first inductor portion and a first portion of the third inductor portion, and the second inductor element includes the second inductor portion and a second portion of the third inductor portion.

4. The semiconductor integrated circuit according to claim 1, wherein the equalization circuit includes:

a first current source connected between a source of the first transistor and a second reference voltage node, the second reference voltage node having a voltage different from a voltage of the first reference voltage node, and a second current source connected between a source of the second transistor and the second reference voltage node, the second current source having the same circuit configuration as a circuit configuration of the first current source.

5. The semiconductor integrated circuit according to claim 1, wherein an inductance of the first inductor element is equal to an inductance of the second inductor element, and a resistance value of the first resistance element is equal to a resistance value of the second resistance element.

6. A semiconductor integrated circuit comprising:

a substrate including a first wiring layer and a second wiring layer, the second wiring layer separated from the first wiring layer in a stacking direction;

an equalization circuit disposed on the substrate and configured to amplify a signal level of a part of a frequency bandwidth included in a differential input signal, the differential input signal including a first signal and a second signal having logics opposite to each other, and configured to output a differential output signal including a third signal and a fourth signal, the third signal corresponding to the first signal and the fourth signal corresponding to the second signal;

a first node to which the first signal is input;

a second node to which the second signal is input;

a third node from which the third signal is output; and a fourth node from which the fourth signal is output, wherein the equalization circuit includes:

a first transistor having a gate connected to the first node and a drain connected to the third node, a first inductor element and a first resistance element connected in series between the drain of the first transistor and a first reference voltage node, a second transistor having a gate connected to the second node and a drain connected to the fourth node, and a second inductor element and a second resistance element connected in series between the drain of the second transistor and the first reference voltage node, wherein each of the first inductor element and the second inductor element is a part of a synthetic inductor element, the synthetic inductor element having a first inductor portion, a second inductor portion, and a third inductor portion, the first inductor portion is disposed in a first region of the first wiring layer, has a first end portion, and includes a single-layer winding coil, the second inductor portion is disposed in a second region of the first wiring layer, the second region being different from the first region, the second inductor portion has a second end portion, and includes a single-layer winding coil, the third inductor portion is disposed at the second wiring layer, and has a third end portion and a fourth end portion, and the third end portion of the third inductor portion is electrically connected to the first end portion of the first inductor portion, and the fourth end portion of the third inductor portion is electrically connected to the second end portion of the second inductor portion, wherein the equalization circuit includes:

a third inductor element connected between the third node and the drain of the first transistor, and a fourth inductor element connected between the fourth node and the drain of the second transistor.

7. The semiconductor integrated circuit according to claim 6, wherein when seen in the stacking direction, the third inductor element overlaps with at least a part of the second inductor element, and when seen in the stacking direction, the fourth inductor element overlaps with at least a part of the first inductor element.

8. The semiconductor integrated circuit according to claim 6, wherein the substrate further includes a third wiring layer and a fourth wiring layer, the third wiring layer separated from the second wiring layer in the stacking direction, the fourth wiring layer separated from the third wiring layer in the stacking direction, the third inductor element includes:
a fourth inductor portion provided in a fifth region of the third wiring layer, and
a fifth inductor portion provided at the fourth wiring layer, and electrically connected to the fourth inductor portion, and the fourth inductor element includes:
a sixth inductor portion provided in a sixth region of the third wiring layer, the sixth region being different from the fifth region, and
a seventh inductor portion provided at the fourth wiring layer, and electrically connected to the sixth inductor portion.

9. The semiconductor integrated circuit according to claim 8,
wherein the fourth inductor portion overlaps with at least a part of the fifth inductor portion, when seen in the stacking direction, and
the sixth inductor portion overlaps with at least a part of the seventh inductor portion, when seen in the stacking direction.

10. The semiconductor integrated circuit according to claim 8,
wherein the first inductor portion overlaps with at least a part of each of the third inductor portion, the sixth inductor portion, and the seventh inductor portion, when seen in the stacking direction, and
the second inductor portion overlaps with at least a part of each of the third inductor portion, the fourth inductor portion, and the fifth inductor portion, when seen in the stacking direction.

11. The semiconductor integrated circuit according to claim 1,
wherein the equalization circuit further includes:
a first via that extends in the stacking direction, and electrically connects the third end portion of the third inductor portion and the first end portion of the first inductor portion, and
a second via that extends in the stacking direction, and electrically connects the fourth end portion of the third inductor portion and the second end portion of the second inductor portion.

12. The semiconductor integrated circuit according to claim 1,
wherein the first inductor portion overlaps with at least a part of the first portion of the third inductor portion, when seen in the stacking direction, and
the second inductor portion overlaps with at least a part of the second portion of the third inductor portion, when seen in the stacking direction.

13. The semiconductor integrated circuit according to claim 1 wherein the first inductor portion, the second inductor portion and the third inductor portion are of a same material.

14. A reception device comprising:
the semiconductor integrated circuit according to claim 1; and
an A/D converter circuit configured to convert an output signal of the equalization circuit included in the semiconductor integrated circuit into a digital signal.

15. The reception device according to claim 14,
wherein when seen in the stacking direction, the third inductor portion in a third region of the second wiring layer overlaps with at least a part of the first inductor portion in the first region of the first wiring layer, and
when seen in the stacking direction, the third inductor portion in a fourth region of the second wiring layer overlaps with at least a part of the second inductor portion in the second region of the first wiring layer.

16. The reception device according to claim 14,
wherein the first inductor element includes the first inductor portion and a first portion of the third inductor portion, and
the second inductor element includes the second inductor portion and a second portion of the third inductor portion.

17. The reception device according to claim 14,
wherein an inductance of the first inductor element is equal to an inductance of the second inductor element, and a resistance value of the first resistance element is equal to a resistance value of the second resistance element.

18. The semiconductor integrated circuit according to claim 6,
wherein when seen in the stacking direction, the third inductor portion in a third region of the second wiring layer overlaps with at least a part of the first inductor portion in the first region of the first wiring layer, and
when seen in the stacking direction, the third inductor portion in a fourth region of the second wiring layer overlaps with at least a part of the second inductor portion in the second region of the first wiring layer.

19. A reception device comprising:
the semiconductor integrated circuit according to claim 6; and
an A/D converter circuit configured to convert an output signal of the equalization circuit included in the semiconductor integrated circuit into a digital signal.

20. The reception device according to claim 19,
wherein when seen in the stacking direction, the third inductor portion in a third region of the second wiring layer overlaps with at least a part of the first inductor portion in the first region of the first wiring layer, and
when seen in the stacking direction, the third inductor portion in a fourth region of the second wiring layer overlaps with at least a part of the second inductor portion in the second region of the first wiring layer.

* * * * *